(12) United States Patent
Kim et al.

(10) Patent No.: US 9,202,848 B2
(45) Date of Patent: Dec. 1, 2015

(54) ORGANIC LIGHT-EMITTING DISPLAY APPARATUS

(71) Applicant: Samsung Display Co., Ltd., Yongin (KR)

(72) Inventors: Jae-Kyoung Kim, Yongin (KR); Gee-Bum Kim, Yongin (KR); Won-Sang Park, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 135 days.

(21) Appl. No.: 14/216,834

(22) Filed: Mar. 17, 2014

(65) Prior Publication Data
US 2015/0137082 A1    May 21, 2015

(30) Foreign Application Priority Data
Nov. 19, 2013   (KR) .................. 10-2013-0140893

(51) Int. Cl.
*H01L 27/32*   (2006.01)
*H01L 51/52*   (2006.01)

(52) U.S. Cl.
CPC ........ *H01L 27/3211* (2013.01); *H01L 51/5203* (2013.01)

(58) Field of Classification Search
CPC ............ H01L 27/3211; H01L 27/3216; H01L 27/3218; H01L 51/5203
See application file for complete search history.

(56) References Cited

U.S. PATENT DOCUMENTS

| | | | |
|---|---|---|---|
| 8,212,269 B2 | 7/2012 | Karg et al. | |
| 2008/0023724 A1* | 1/2008 | Takeda | H01L 51/5262 257/103 |
| 2011/0084291 A1 | 4/2011 | Jeong et al. | |
| 2011/0121271 A1 | 5/2011 | Jeon et al. | |
| 2012/0138918 A1 | 6/2012 | Naraoka et al. | |
| 2014/0065750 A1* | 3/2014 | Harikrishna Mohan | H01L 51/5265 438/35 |

FOREIGN PATENT DOCUMENTS

| | | |
|---|---|---|
| KR | 10-0721942 | 5/2007 |
| KR | 10-2011-0039056 | 4/2011 |
| KR | 10-2013-0037445 | 4/2013 |

* cited by examiner

*Primary Examiner* — Jose R Diaz
(74) *Attorney, Agent, or Firm* — H.C. Park & Associates, PLC (57) ABSTRACT

Provided is an organic light-emitting display apparatus, including a substrate, a first pixel electrode, a second pixel electrode, and a third pixel electrode, disposed on the substrate separated from one another, a red emission layer disposed corresponding to the first pixel electrode, a green emission layer disposed corresponding to the second pixel electrode, and a blue emission layer disposed corresponding to the third pixel electrode, an opposite electrode disposed over the red, green, and blue emission layers facing the first to third pixel electrodes, a first capping layer disposed on the opposite electrode corresponding to the first and second pixel electrodes, and a second capping layer disposed on the first capping layer corresponding to the first and second pixel electrodes and disposed on the opposite electrode to correspond to the third pixel electrode.

19 Claims, 3 Drawing Sheets

ORGANIC LIGHT-EMITTING DISPLAY APPARATUS

CROSS REFERENCE TO RELATED APPLICATION

This application claims priority from and the benefit of Korean Patent Application No. 10-2013-0140893, filed on Nov. 19, 2013 which is hereby incorporated by the reference for all purposes as if fully set forth herein.

BACKGROUND

1. Field

Exemplary embodiments of the present invention relate to a display apparatus, and more particularly, to an organic light-emitting display apparatus.

2. Discussion of the Background

Organic light-emitting display apparatuses each include an organic light-emitting device (OLED) as a pixel, and the OLED includes a pixel electrode and an opposite electrode facing each other, and an intermediate layer disposed therebetween having an emission layer. Light generated by the emission layer is emitted outward and observed by a user. However, all the light generated by the emission layer is not emitted outward. In other words, some of the light generated by the emission layer is guided along the boundaries in a multilayer structure including the pixel electrode, intermediate layer, and the opposite layer. Accordingly, an organic light-emitting display apparatus generally shows insufficient brightness in the front.

To overcome such limitation and increase an amount of light emitted outward, a method of increasing an amount of currents flowing through between the pixel electrode and the opposite electrode has been provided.

However, in general organic light-emitting display apparatuses, as the amount of flowing currents increases, the intermediate layer between the pixel electrode and the opposite electrode easily becomes deteriorated.

The above information disclosed in this Background section is only for enhancement of understanding of the background of the invention and therefore it may contain information that does not form any part of the prior art nor what the prior art may suggest to a person of ordinary skill in the art.

SUMMARY

Exemplary embodiments of the present invention provide an organic light-emitting display apparatus capable of increasing brightness in front thereof and reducing variations in color when seen from the sides.

Additional features of the invention will be set forth in the description which follows, and in part will be apparent from the description, or may be learned by practice of the invention.

An exemplary embodiment of the present invention discloses an organic light-emitting display apparatus, including a substrate, a first pixel electrode for emitting red light, a second pixel electrode for emitting green light, and a third pixel electrode for emitting blue light, disposed on the substrate separated from one another, a red emission layer disposed corresponding to the first pixel electrode, a green emission layer disposed corresponding to the second pixel electrode, and a blue emission layer disposed corresponding to the third pixel electrode, an opposite electrode disposed over the red emission layer, the green emission layer, and the blue emission layer facing the first pixel electrode, the second pixel electrode, and the third pixel electrode, a first capping layer disposed on the opposite electrode corresponding to the first pixel electrode and the second pixel electrode, and a second capping layer disposed on the first capping layer corresponding to the first pixel electrode and the second pixel electrode, and disposed on the opposite electrode to correspond to the third pixel electrode.

An exemplary embodiment of the present invention also discloses an organic light-emitting display apparatus, comprising a substrate, a first sub-pixel configured to emit a first color light, a second sub-pixel configured to emit a second color light, and a third sub-pixel configured to emit a third color light disposed on the substrate, a first pixel electrode disposed in the first sub-pixel, a second pixel electrode disposed in the second sub-pixel, and a third pixel electrode disposed in the third sub-pixel, a first emission layer disposed on the first pixel electrode, a second emission layer disposed on the second pixel electrode, and a third emission layer disposed on the third pixel electrode, an opposite electrode disposed on the first emission layer, the second emission layer, and the third emission layer, a first capping layer disposed on the opposite electrode and in the first sub-pixel and the second sub-pixel but not the third sub-pixel, and a second capping layer disposed on the first capping layer and in the first sub-pixel, the second sub-pixel, and the third sub-pixel.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Since the present invention may have various modifications and several embodiments, exemplary embodiments are shown in the drawings and will be described in detail. Advantages, features, and a method of achieving the same will be specified with reference to embodiments described below in detail together with the attached drawings. However, the embodiments may have different forms and should not be construed as being limited to the descriptions set forth herein.

Hereinafter, the embodiments of the present invention will be described in detail with reference to the attached drawings, in which like reference numerals refer to like elements and a repetitive explanation thereof will be omitted.

On the other hand, it will be understood that when a layer, region, or component is referred to as being formed "on" another layer, region, or component, it can be directly or indirectly formed on the other layer, region, or component. That is, for example, intervening layers, regions, or components may be present. In contrast, when an element or layer is referred to as being "directly on" or "directly connected to" another element or layer, there are no intervening elements or layers present. Also, for convenience of description, in the drawings, sizes of elements may be exaggerated or contracted. For example, since sizes and thicknesses of components in the drawings are arbitrarily illustrated for convenience of explanation, the following embodiments are not limited thereto. As used herein, the term "and/or" includes any and all combinations of one or more of the associated listed items. It will be understood that for the purposes of this disclosure, "at least one of X, Y, and Z" can be construed as X only, Y only, Z only, or any combination of two or more items X, Y, and Z (e.g., XYZ, XYY, YZ, ZZ).

Figure 1:
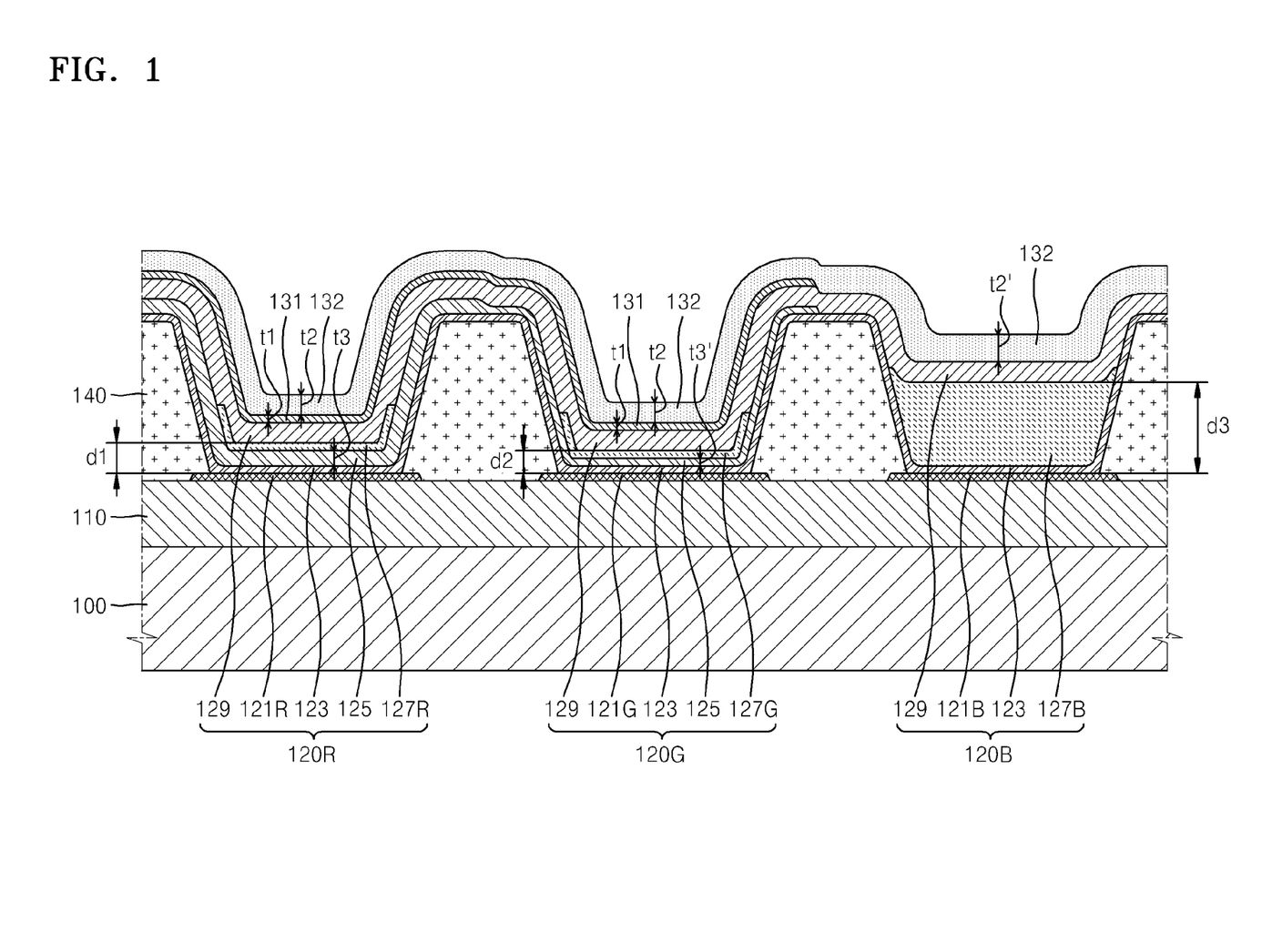
FIG. 1 is a schematic cross-sectional view illustrating an organic light-emitting display apparatus according to an exemplary embodiment of the present invention.

FIG. 1 is a schematic cross-sectional view illustrating an organic light-emitting display apparatus according to an exemplary embodiment of the present invention. The organic light-emitting display apparatus includes a red sub-pixel 120R, a green sub-pixel 120G, and a blue sub-pixel 120B disposed on a substrate 100. Although present exemplary embodiment specifies red, green and blue sub-pixels, present invention is not limited thereto, and may include other colors, such as cyan, magenta, and yellow.

The substrate 100 may be formed of at least one of various materials such as glass, metal, and plastic including polyethylene terephthalate (PET), polyethylene naphthalate (PEN), and polyimide. On the substrate 100, the red sub-pixel 120R, the green sub-pixel 120G, and the blue sub-pixel 120B are disposed. If necessary, between the substrate 100, and the red sub-pixel 120R, the green sub-pixel 120G, and the blue sub-pixel 120B, a thin film transistor (TFT) layer 110 may be disposed. The TFT layer 110 may include a TFT (not shown) or capacitor (not shown) electrically connected to the red sub-pixel 120R, the green sub-pixel 120G, and the blue sub-pixel 120B.

The red sub-pixel 120R includes a first pixel electrode 121R and a red emission layer 127R disposed above the first pixel electrode 121R to correspond thereto, the green sub-pixel 120G includes a second pixel electrode 121G and a green emission layer 127G disposed above the second pixel electrode 121G to correspond thereto, and the blue sub-pixel 120B includes a third pixel electrode 121B and a blue emission layer 127B disposed above the third pixel electrode 121B to correspond thereto. An opposite electrode 129, which may include a single layer or multiple layers, is disposed above the red emission layer 127R, green emission layer 127G, and blue emission layer 127B.

The first, second, and third pixel electrodes 121R, 121G, and 121B each may include a reflective film formed of at least one of silver (Ag), magnesium (Mg), aluminum (Al), platinum (Pt), palladium (Pd), gold (Au), Nickel (Ni), neodymium (Nd), iridium (Ir), chrome (Cr), and a compound thereof and a layer formed of at least one of ITO, IZO, ZnO, and $In_2O_3$. The opposite electrode 129 is at least one of a transparent electrode and a semitransparent electrode, for example, may be formed of at least one of ITO, IZO, ZnO, $In_2O_3$, and the like. The configurations and materials of first, second, and third pixel electrodes 121R, 121G, and 121B and the opposite electrode 129 are not limited thereto and may be variously modified.

Also, the exemplary embodiment of the present invention may include a first capping layer 131 and a second capping layer 132. The first capping layer 131 is disposed above the opposite electrode 129 to correspond to the first pixel electrode 121R and second pixel electrode 121G. The second capping layer 132 is disposed above the first capping layer 131 to correspond to the first pixel electrode 121R and second pixel electrode 121G and is disposed above the opposite electrode 129 to correspond to the third pixel electrode 121B. In other words, the first capping layer 131 and second capping layer 132 are sequentially disposed above the red sub-pixel 120R and green sub-pixel 120G, while only the second capping layer 132 is disposed above the blue unit electrode 120B.

In the exemplary embodiment of the organic light-emitting display apparatus as described above, the first capping layer 131 and second capping layer 132 may increase the brightness in front. Also, the first capping layer 131 and second capping layer 132 may reduce color coordinate variations when the organic light-emitting display apparatus is seen from the sides, compared to when seen from the front.

In detail, a refractive index of the second capping layer 132 may be greater than that of the first capping layer 131. In this exemplary embodiment, red light emitted from the red emission layer 127R passes through the first capping layer 131, enters the second capping layer 132, and is emitted into the air. As the red light advances from the second capping layer 132 having a higher refractive index to the air having the lower refractive index than the second capping layer 132, a portion of the red light is totally reflected at a boundary between the second capping layer 132 and the air. The totally reflected light in turn advances from the second capping layer 132 having the higher refractive index to the first capping layer 131 having the lower refractive index than the second capping layer 132, and a portion of the reflected light is again totally reflected at a boundary between the second capping layer 132 and the first capping layer 131. In other words, a cavity is formed within the second capping layer 132, amplifying and thereby notably increasing the brightness of the red light in front. The brightness of the green sub-pixel 120G in front may also be increased in a similar way. The difference in refractive indexes between the first capping layer 131 and the second capping layer 132 may be 1 or more.

On the other hand, in case of the blue sub-pixel 120B, a resonance occurring in the second capping layer 132 as in the red sub-pixel 120R or green sub-pixel 120G may increase the color coordinate variations in blue color when the apparatus is seen from the sides, exacerbating the visibility from the sides. Accordingly, the first capping layer 131 is not disposed above the blue sub-pixel 120B, while only the second capping layer 132 may be disposed.

Figure 2:
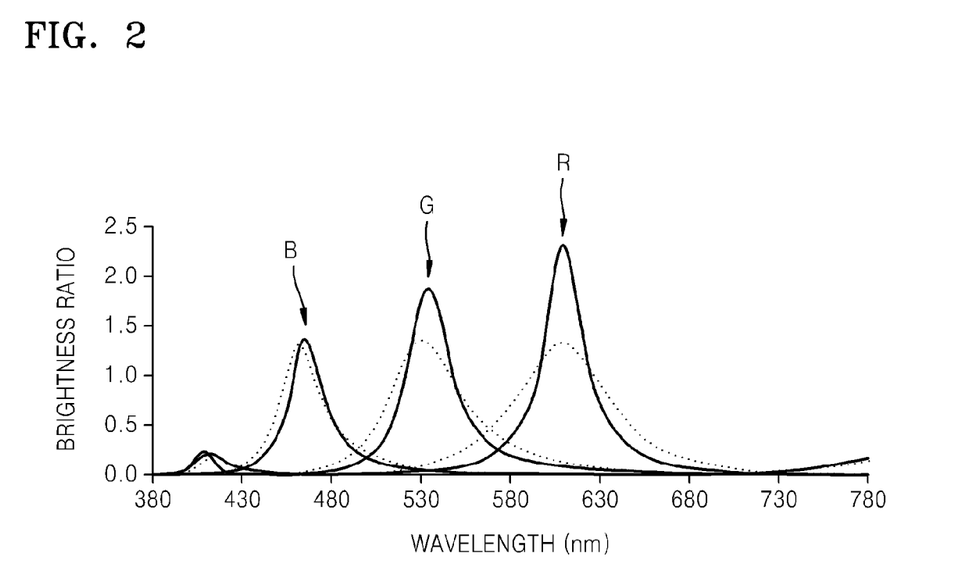
FIG. 2 is a graph schematically illustrating brightness observed outside the organic light-emitting display apparatus, when the organic light-emitting display apparatus does not include a capping layer disposed above an opposite electrode, and when the organic light-emitting display apparatus includes a capping layer having different thicknesses disposed above the opposite electrode.

FIG. 2 is a graph schematically illustrating brightness observed outside the apparatus, when the organic light-emitting display apparatus does not include a capping layer disposed above an opposite electrode, and when the organic light-emitting display apparatus includes a capping layer having different thicknesses disposed above the opposite electrode. Specifically, a dotted line of the graph illustrates brightness observed outside the apparatus when the apparatus does not include a capping layer disposed above the opposite electrode 129, and a solid line of the graph illustrates brightness observed outside when apparatus includes a capping layer having different thicknesses.

Referring to FIG. 2, the brightness of the apparatus improves when the apparatus includes the capping layer having the different thicknesses disposed on the opposite electrode 129 above the red sub-pixel 120R, green sub-pixel 120G, and blue sub-pixel 120B, respectively. However, the capping layer having the different thicknesses disposed above the opposite electrode 129 may increase a variation in color coordinates of the apparatus when seen diagonally from the sides compared to the front.

Table 1, included below, compares color coordinates observed outside the apparatus when the apparatus uses a first resonance structure wherein distances from the pixel electrodes 121R, 121G, and 121B to the opposite electrode 129 are each controlled so that first resonances occur in the red sub-pixel 120R, the green sub-pixel 120G, and the blue sub-pixel 120B, respectively, thereby increasing brightness observed outside the apparatus without any capping layer disposed, and when a capping layer having different thickness above the respective red sub-pixel 120R, the green sub-pixel 120G, and the blue sub-pixel 120B is disposed without first resonance structure in the sub-pixels 120R, 120G, and 120B. Table 1 also shows a ratio of brightness of red light, green light, and blue light between the two examples described above, and color coordinate variations (WAD) when the apparatus is seen from an angle of 60 degrees in the two examples.

TABLE 1

|  | Red light | | Green light | | Blue light | | Color coordinate variation |
| --- | --- | --- | --- | --- | --- | --- | --- |
|  | Rx | Ry | Gx | Gy | Bx | By |  |
| First resonance + Structure without capping layer | 0.675 | 0.323 | 0.261 | 0.672 | 0.140 | 0.080 | 0.003 |
| Disposing capping layer having different thicknesses | 0.668 | 0.330 | 0.208 | 0.774 | 0.136 | 0.053 | 0.049 |
| Brightness ratio | 1.20 | | 1.04 | | 0.95 | | |

According to Table 1, compared to the example using the first resonance structure without capping layer, the example using the capping layer having the different thicknesses disposed in the red sub-pixel 120R, the green sub-pixel 120G, and the blue sub-pixel 120B without the first resonance structure shows about 20% increase of brightness in the red sub-pixel 120R, slight increase of brightness in the green sub-pixel 120G, and slight decrease of brightness in the blue sub-pixel 120B. However, considering the color coordinate variations, the example using the first resonance structure without capping layer shows color coordinate variation of about 0.003, while the example with the capping layer having the different thicknesses disposed in the respective red sub-pixel 120R, the green sub-pixel 120G, and the blue sub-pixel 120B without the first resonance structure shows color coordinate variation of about 0.049, indicating exacerbated visibility from the sides. Table 1 also shows that the quality of the blue light is exacerbated in case of the first resonance structure, since the color coordinate values (Bx=0.140, By=0.080) of blue light are distant from a desirable value, which is approximately 0.5.

According to Table 1, comparing the example with the capping layer having the different thicknesses disposed in the respective red sub-pixel 120R, the green sub-pixel 120G, and the blue sub-pixel 120B above the opposite electrode 129 without the first resonance structure to the example with the first resonance structure without capping layer, the red sub-pixel 120R shows notable increase in brightness and the green sub-pixel 120G shows increase in brightness, but the blue sub-pixel 120B shows no increase in brightness but increase in color coordinate variations when the apparatus is seen from the sides. Accordingly, the capping layer may be considered for the red sub-pixel 120R and the green sub-pixel 120G despite the increase in the color coordinate variations, but not for the blue sub-pixel 120B.

Therefore, according to an exemplary embodiment of the present invention, the first capping layer 131 and the second capping layer 132 may be disposed on the red sub-pixel 120R and green sub-pixel 120G to increase brightness of the red light and green light using the difference in the refractive indexes between the first capping layer 131 and the second capping layer 132. On the other hand, for the blue sub-pixel 120B, only the second capping layer 132 may be disposed on the blue sub-pixel 120B. From such structure of the exemplary embodiment, overall brightness in front of the apparatus may be increased while preventing a large increase of color coordinate variations when seen from the sides.

Figure 3:
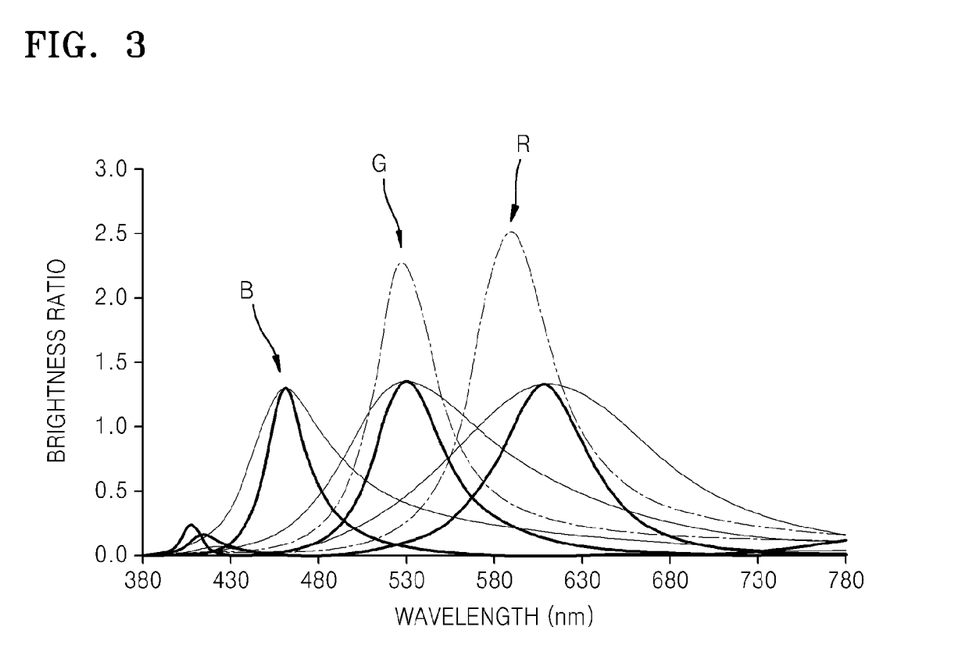
FIG. 3 is a graph schematically illustrating brightness observed outside the organic light-emitting display apparatus, in case when first resonances occur in the red, green, and blue sub-pixels by controlling respective distances from the pixel electrodes to the opposite electrode, in case when second resonances occur in the red, green, and blue sub-pixels, and in case of hybrid structure when first resonances occur in the red and green sub-pixels, second resonance occurs in the blue sub-pixel, and the capping layer is disposed in respective sub-pixels.

FIG. 3 is a graph schematically illustrating brightness observed outside the organic light-emitting display apparatus, in case when first resonances occur in the red, green, and blue sub-pixels by controlling respective distances from the pixel electrodes to the opposite electrode, in case when second resonances occur in the red, green, and blue sub-pixels, and in case of hybrid structure when first resonances occur in the red and green sub-pixels, second resonance occurs in the blue sub-pixel, and the capping layer is disposed in respective sub-pixels. Specifically, a thin solid line of the graph illustrates the brightness outside the apparatus when first resonances occur in the red sub-pixel 120R, the green sub-pixel 120G, and the blue sub-pixel 120B, respectively, by controlling distances from the pixel electrodes 121R, 121G, and 121B to the opposite electrode 129, a thick solid line of the graph illustrates the brightness outside the apparatus when second resonances occur, and an one-dot chain line of the graph illustrates the brightness outside the apparatus when first resonances occur in the red sub-pixel 120R and green sub-pixel 120G, a second resonance occurs in the blue sub-pixel 120B, and a capping layer is disposed above respective subpixels as. Disposing the capping layer above the respective subpixels means disposing the first capping layer 131 and the second capping layer 132 above the red sub-pixel 120R and green sub-pixel 120G and disposing while only the second capping layer 132 above the blue sub-pixel 120B.

Referring to FIG. 3, compared to the other examples, the brightness of the apparatus notably increases when first resonances occur in the red sub-pixel 120R and green sub-pixel 120G by controlling the distances from the first and second pixel electrodes 121R and 121G to the opposite electrode 129 with the first capping layer 131 and second capping layer 132 disposed above the red sub-pixel 120R and green sub-pixel 120G.

Table 2, included below, shows color coordinates observed outside the apparatus when first resonances occur in the red sub-pixel 120R, green sub-pixel 120G, and blue sub-pixel 120B by controlling the distance between the pixel electrodes 121R, 121G, and 121B and the opposite electrode 129, and color coordinates outside the apparatus when second resonances occur. Table 2 also shows color coordinates outside when first resonances occur in the red sub-pixel 120R and green sub-pixel 120G, a second resonance occurs in the blue sub-pixel 120B, and a capping layer is disposed above respective subpixels. Disposing the capping layer above the respective subpixels means disposing the first capping layer 131 and the second capping layer 132 above the red sub-pixel 120R and green sub-pixel 120G and disposing while only the second capping layer 132 above the blue sub-pixel 120B. (Titled "hybrid structure" in Table 2). Additionally, Table 2 shows color coordinate variations (WAD) when the apparatus is seen from an angle of about 60 degrees for the respective cases.

TABLE 2

|  | Red light | | Green light | | Blue light | | Color coordinate |
| --- | --- | --- | --- | --- | --- | --- | --- |
|  | Rx | Ry | Gx | Gy | Bx | By | variation |
| First resonance + Structure without capping layer | 0.675 | 0.323 | 0.261 | 0.672 | 0.140 | 0.080 | 0.003 |
| Second resonance + Structure without capping layer | 0.670 | 0.328 | 0.213 | 0.726 | 0.139 | 0.049 | 0.022 |
| Hybrid structure | 0.659 | 0.340 | 0.213 | 0.724 | 0.139 | 0.049 | 0.009 |

According to Table 2, the color coordinate of the blue light considerably deviates from a desirable case when the first resonance structure is used in the blue sub-pixel. However, the color coordinate of the blue light shows improved result when using the second resonance structure or hybrid structure. Accordingly, in the blue sub-pixel 120B, the distance between the third pixel electrode 121B and the opposite electrode 129 may be configured to correspond to a second resonance structure of blue light. In order to correspond to the second resonance structure of the blue light, the distance d3 between a surface of the opposite electrode 129 facing the third pixel electrode 121B and a surface of the third pixel electrode 121B facing the opposite electrode 129, may be from about 1850 Å to about 1950 Å.

On the other hand, since using the second resonance structure may increase the color coordinate variation, the red light and green light that show color coordinates are close to desirable values, may have first resonance structure, by configuring the distances from the first pixel electrode 121R and second pixel electrode 121G to the opposite electrode 129, thereby reducing deterioration of visibility when seen from the sides. More specifically, a distance d1 between a surface of the opposite electrode 129 facing the first pixel electrode 121R and a surface of the first pixel electrode 121R facing the opposite electrode 129 may be from about 600 Å to about 800 Å. Also, a distance d2 between a surface of the opposite electrode 129 facing the second pixel electrode 121G and a surface of the second pixel electrode 121G facing the opposite electrode 129 may be from about 500 Å to about 700 Å.

Referring back to FIG. 1, to satisfy the conditions of the second resonance structure of the blue light and the first resonance structure of the red light and green light as described above, an exemplary embodiment of the present invention may include the blue emission layer 127B which is thicker than the red emission layer 127R and green emission layer 127G.

With respect to the red light and green light, the distances d1 between the first pixel electrode 121R and the opposite electrode 129 and d2 between the second pixel electrode 121G and the opposite electrode 129 may be configured differently corresponding to the first resonance structure of the red light and green light, respectively. Accordingly, as shown in FIG. 1, the red sub-pixel 120R may include a red auxiliary layer having a thickness t3 disposed between the first pixel electrode 121R and the red emission layer 127R, and the green sub-pixel 120G may include a green auxiliary layer having a thickness t3' disposed between the second pixel electrode 121G and the green emission layer 127G. The thickness t3 of the red auxiliary layer may be greater than the thickness t3' of the green auxiliary layer.

The red auxiliary layer and green auxiliary layer may be formed as a single layer, an auxiliary layer 125. The auxiliary layer 125 may be formed to have the thickness t3 in the red sub-pixel 120R and the thickness t3' in the green sub-pixel 120G, wherein the thickness t3 and the thickness t3' are different from each other. The auxiliary layer 125 may be formed using a halftone mask. The red auxiliary layer and green auxiliary layer, for example, may be formed of any material suitable for a hole-injection material and a hole-transporting material.

Additional to the red auxiliary layer and green auxiliary layer or multiple layers, a common layer 123 may be formed as a single layer throughout the red sub-pixel 120R, green sub-pixel 120G, and blue sub-pixel 120B. The common layer 123, for example, may be formed of any material suitable for a hole-injection material and a hole-transporting material. Additional layers formed of an electron-transporting material and an electron-injection material may further be disposed between the emission layers 127R, 127G, and 127B and the opposite electrode 129.

According to Table 2, the hybrid structure selectively includes both of the features described above, which means that the first resonance structure is included in the red sub-pixel 120R and green sub-pixel 120G and the second resonance structure is included in the blue sub-pixel 120B, with the capping layer disposed above the respective subpixels. Disposing the capping layer above the respective subpixels means disposing the first capping layer 131 and the second capping layer 132 above the red sub-pixel 120R and green sub-pixel 120G and while only disposing the second capping layer 132 above the blue sub-pixel 120B. Referring to Table 2, the hybrid structure shows that the color coordinates of the red light, green light, and blue light are close to standard values, and that the color coordinate variations are low. Accordingly, the hybrid structure as described above may provide an organic light-emitting display apparatus capable of displaying images having high quality.

Figure 4:
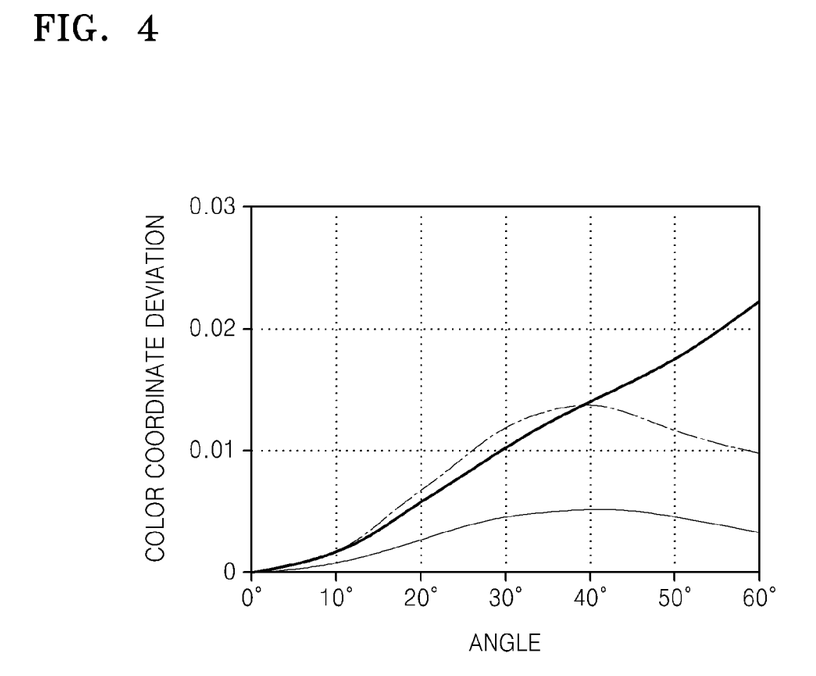
FIG. 4 is a graph schematically illustrating color coordinate deviations according to viewing angles, in case when first resonances occur in the red, green, and blue sub-pixels by controlling the respective distances from the pixel electrodes to the opposite electrode, in case when second resonances occur in the red, green, and blue sub-pixels, and in case of hybrid structure when the first resonances occur in the red and green sub-pixels, the second resonance occurs in the blue sub-pixel, and a capping layer is disposed in the respective subpixels.

FIG. 4 is a graph schematically illustrating a color coordinate deviations according to viewing angles, in case when first resonances occur in the red, green, and blue sub-pixels by controlling the respective distance from the pixel electrodes to the opposite electrode, in case when second resonances occur in the red, green, and blue sub-pixels, and in case of hybrid structure when the first resonance occurs in the red and green sub-pixels, the second resonance occurs in the blue sub-pixel, and a capping layer is disposed in the respective subpixels. Specifically, a thin solid line of the graph illustrates the color coordinate deviation according to a viewing angle when first resonances occur in the red sub-pixel 120R, the green sub-pixel 120G, and the blue sub-pixel 120B, respectively, by controlling the distance between the pixel electrodes 121R, 121G, and 121B and the opposite electrode 129, a thick solid line of the graph illustrates the color coordinate deviation according to a viewing angle when second resonances occur in the red, green, and blue sub-pixels, and an one-dot chain line of the graph illustrates the color coordinate deviation according to a viewing angle when hybrid structure is used.

Referring to FIG. 4, when applying the second resonance structure, the color coordinate variation largely increases as the viewing angle of the organic light-emitting display apparatus increases, which exacerbates the visibility from the sides. However, when the hybrid structure is used, the color coordinate deviations decrease as the viewing angle of the organic light-emitting display apparatus increases when the viewing angle becomes greater than 40 degrees.

Accordingly, the hybrid structure, in which first resonances may occur in the red sub-pixel 120R and green sub-pixel 120G, respectively, by controlling the distances from the first pixel electrode 121R and second pixel electrode 121G to the opposite electrode 129, the second resonance may occur in the blue sub-pixel 120B by controlling the distance between the third pixel electrode 121B and the opposite electrode 129, and the first capping layer 131 and second capping layer 132 may be disposed above the red sub-pixel 120R and green sub-pixel 120G while only the second capping layer 132 may be disposed above the blue sub-pixel 120B, may notably increase the brightness in front of the apparatus while reducing variations in color when the apparatus is seen from the sides.

However, the present invention is not limited to the above exemplary embodiments. For example, an nth resonances may occur in the red sub-pixel 120R and green sub-pixel 120G, respectively, by controlling the distances from the first and second pixel electrodes 121R and 121G to the opposite electrode 129 and an mth resonance may occur in the blue sub-pixel 120B by controlling the distance between the third pixel electrode 121B and the opposite electrode 129. In this case, n is a natural number and m is a natural number greater than n. Accordingly, the embodiment described above may be understood that n=1 and m=2.

Since the color coordinate may be improved for the blue light as an ordinal number of resonance increases, resonance structure of a higher ordinal number may be considered in the blue sub-pixel 120B. However, since a resonance of a higher ordinal number may exacerbate the visibility from the sides, the red sub-pixel 120R and green sub-pixel 120G may include a resonance structures of ordinal numbers lower than that in the blue sub-pixel 120B, thereby reducing overall deterioration of the visibility.

On the other hand, referring to Table 1, when a capping layer having a first thickness is formed above the red sub-pixel 120R for a resonance to occur with respect to the red light and a capping layer having a second thickness is formed above the green sub-pixel 120G for a resonance to occur with respect to the green light, brightness of the red light increases about 20% but brightness of the green light increases only about 4%. Accordingly, the first capping layer 131 and second capping layer 132 may be disposed together above the red sub-pixel 120R and green sub-pixel 120G to have one thicknesses optimized for the red light instead of the green light. That is, a thickness of a part of the first capping layer 131, corresponding to the first pixel electrode 121R and a thickness of a part of the first capping layer 131, corresponding to the second pixel electrode 121G may have identical thickness t1, and a thickness of a part of the second capping layer 132, corresponding to the first pixel electrode 121R and a thickness of a part of the second capping layer 132, corresponding to the second pixel electrode 121G may have identical thickness t2. For example, the first capping layer 131 may have a thickness of about 100 Å and the second capping layer 132 may have a thickness of about 500 Å. According to the present exemplary embodiment, a manufacturing process of the organic light-emitting display apparatus may be more simplified, thereby increasing a manufacturing yield while increasing overall brightness of the apparatus.

On the other hand, a thickness t2' of a part of the second capping layer 132 corresponding to the third pixel electrode 121B may be greater than a thickness t2 of a part of the second capping layer 132 corresponding to the first pixel electrode 121R. Specifically, the thickness t2' of the part of the second capping layer 132, corresponding to the third pixel electrode 121B, may be identical to a sum of the thickness t1 of a part of the first capping layer 131, and the thickness t2 of the part of the second capping layer 132.

Referring to FIG. 1, a top surface of a pixel defining film 140 is covered with the common layer 123, the auxiliary layer 125, the opposite electrode 129, and the first capping layer 131 and/or second capping layer 132. Among them, the common layer 123 and the auxiliary layer 125 have thicknesses relatively smaller than the opposite electrode 129 and the first capping layer 131 and/or second capping layer 132. Accordingly, a total thickness of the layers above the top surface of pixel defining film 140 may be approximately determined by the thicknesses of the opposite electrode 129 and the first capping layer 131 and/or second capping layer 132.

As described above, since the first capping layer 131 is located only above the red sub-pixel 120R and green sub-pixel 120G, in order to allow the total thickness of the layers above the top surface of the pixel defining film 140 to be approximately similar in an overall display region, the thickness t2' of the part of the second capping layer 132 corresponding to the third pixel electrode 121B, may be greater than the thickness t2 of the part of the second capping layer 132 corresponding to the first pixel electrode 121R and the second pixel electrode 121G. For example, when the thickness t2' may be identical to the sum of the thickness t1 of a part of the first capping layer 131 corresponding to the first pixel electrode 121R, and the thickness t2 of the part of the second capping layer 132 corresponding to the first pixel electrode 121R, so that the total thickness of the layers above the top surface of the pixel defining film 140 may be approximately similar in overall the display region.

Although not shown in FIG. 1, an encapsulation substrate, etc. may be bonded to the substrate 100 outside the display region. In such case, the external pressure applied to the encapsulation substrate may be uniformly distributed to the pixel defining film 140 in the display region not focused on any one portion by configuring the total thickness of the layers above the top surface of the pixel defining film 140 in the overall display region to be approximately identical. Since the first capping layer 131 is located only above the red sub-pixel 120R and green sub-pixel 120G, the total thickness of the layers above the top surface of the pixel defining film 140 may be approximately similar in the overall display region by configuring the thickness t2' of the part of the second capping layer 132 corresponding to the third pixel electrode 121B, to be greater than the thickness t2 of the part of the second capping layer 132 corresponding to the first pixel electrode 121R and the second pixel electrode 121G. The second capping layer 132 having different thicknesses according to positions, for example, may be formed using a halftone mask.

As described above, according to the one or more of the above embodiments of the present invention, an organic light-emitting display apparatus capable of increasing brightness in front and reducing variations in colors when seeing from sides. However, the scope of the present invention is not limited thereto.

It should be understood that the exemplary embodiments described therein should be considered in a descriptive sense only and not for purposes of limitation. Descriptions of features or aspects within each embodiment should typically be considered as available for other similar features or aspects in other embodiments.

While one or more embodiments of the present invention have been described with reference to the figures, it will be understood by those of ordinary skill in the art that various changes in form and details may be made therein without departing from the spirit and scope of the present invention as defined by the following claims and their equivalents.

What is claimed is:

1. An organic light-emitting display apparatus, comprising:
    a substrate;
    a first pixel electrode for red light, a second pixel electrode for green light, and a third pixel electrode for blue light, disposed on the substrate separated from one another;
    a red emission layer disposed corresponding to the first pixel electrode, a green emission layer disposed corresponding to the second pixel electrode, and a blue emission layer disposed corresponding to the third pixel electrode;
    an opposite electrode disposed over the red emission layer, the green emission layer, and the blue emission layer facing the first pixel electrode, the second pixel electrode, and the third pixel electrode;
    a first capping layer disposed on the opposite electrode corresponding to the first pixel electrode and the second pixel electrode; and
    a second capping layer disposed on the first capping layer corresponding to the first pixel electrode and the second pixel electrode, and directly disposed on the opposite electrode corresponding to the third pixel electrode.

2. The apparatus of claim 1, wherein
    a first distance between a surface of a part of the opposite electrode facing the first pixel electrode and a surface of the first pixel electrode facing the opposite electrode corresponds to an nth resonance distance of light emitted by the red emission layer,
    a second distance between a surface of a part of the opposite electrode facing the second pixel electrode and a surface of the second pixel electrode facing the opposite electrode corresponds to an nth resonance distance of light emitted by the green emission layer,
    a third distance between a surface of a part of the opposite electrode facing the third pixel electrode and a surface of the third pixel electrode facing the opposite electrode corresponds to an mth resonance distance of light emitted by the blue emission layer, and
    n is a natural number and m is a natural number greater than n.

3. The apparatus of claim 2, wherein n=1 and m=2.

4. The apparatus of claim 3, wherein the first distance is from about 600 Å to about 800 Å, the second distance is from about 500 Å to about 700 Å, and the third distance is from about 1850 Å to about 1950 Å.

5. The apparatus of claim 2, further comprising:
    a common layer disposed on each of the first pixel electrode, the second pixel electrode, and the third pixel electrode;
    a red auxiliary layer disposed on the common layer to correspond to the first pixel electrode; and
    a green auxiliary layer disposed on the common layer to correspond to the second pixel electrode.

6. The apparatus of claim 5, wherein the red auxiliary layer is thicker than the green auxiliary layer.

7. The apparatus of claim 2, wherein the blue emission layer is thicker than the red emission layer and the green emission layer.

8. The apparatus of claim 1, wherein
    a thickness of a part of the first capping layer corresponding to the first pixel electrode is identical to a thickness of a part of the first capping layer corresponding to the second pixel electrode, and
    a thickness of the second capping layer corresponding to the first pixel electrode is identical to a thickness of the second capping layer corresponding to the second pixel electrode.

9. The apparatus of claim 8, wherein a part of the second capping layer corresponding to the third pixel electrode is thicker than a part of the second capping layer corresponding to the first pixel electrode.

10. The apparatus of claim 9, wherein a thickness of the part of the second capping layer corresponding to the third pixel electrode, is identical to a sum of the thickness of the part of the first capping layer corresponding to the first pixel electrode, and the thickness of the part of second capping layer corresponding to the first pixel electrode.

11. The apparatus of claim 1, wherein a refractive index of the second capping layer is greater than a refractive index of the first capping layer.

12. An organic light-emitting display apparatus, comprising:
    a substrate;
    a first sub-pixel configured to emit a first color light, a second sub-pixel configured to emit a second color light, and a third sub-pixel configured to emit a third color light disposed on the substrate;
    a first pixel electrode disposed in the first sub-pixel, a second pixel electrode disposed in the second sub-pixel, and a third pixel electrode disposed in the third sub-pixel;
    a first emission layer disposed on the first pixel electrode, a second emission layer disposed on the second pixel electrode, and a third emission layer disposed on the third pixel electrode;
    an opposite electrode disposed on the first emission layer, the second emission layer, and the third emission layer;
    a first capping layer disposed on the opposite electrode in the first sub-pixel and the second sub-pixel but not the third sub-pixel; and
    a second capping layer disposed on the first capping layer in the first sub-pixel and the second sub-pixel, and on the opposite electrode in the third sub-pixel.

13. The apparatus of claim 12, wherein a thickness of the first capping layer in the first sub-pixel equals a thickness of the first capping layer in the second sub-pixel, a thickness of the second capping layer in the first sub-pixel equals a thickness of the second capping layer in the second sub-pixel, and a thickness of the second capping layer in the third sub-pixel exceeds the thickness of the second capping layer in the first sub-pixel.

14. The apparatus of claim 13, wherein the thickness of the second capping layer in the third sub-pixel equals a sum of the thickness of the first capping layer in the first sub-pixel and the thickness of the second capping layer in the first sub-pixel.

15. The apparatus of claim 12, further comprising an auxiliary layer disposed in the first sub-pixel and the second sub-pixel but not the third sub-pixel.

16. The apparatus of claim 15, wherein a thickness of the auxiliary layer in the first sub-pixel exceeds a thickness of the auxiliary layer in the second sub-pixel.

17. The apparatus of claim 16, wherein the auxiliary layer in the first sub-pixel is disposed between the first pixel electrode and the first emission layer, and the auxiliary layer in the second sub-pixel is disposed between the second pixel electrode and the second emission layer.

18. The apparatus of claim 12, wherein the opposite electrode has the same thickness in the first sub-pixel, the second sub-pixel, and the third sub-pixel, and a thickness of the third emission layer exceeds a thickness of the first emission layer and a thickness of the second emission layer.

19. The apparatus of claim 12, wherein a refractive index of the second capping layer is greater than a refractive index of the first capping layer.

\* \* \* \* \*